(12) United States Patent
Hayashi et al.

(10) Patent No.: US 8,872,242 B2
(45) Date of Patent: Oct. 28, 2014

(54) SILICON CARBIDE SEMICONDUCTOR DEVICE AND METHOD FOR MANUFACTURING THE SAME

(71) Applicant: Sumitomo Electric Industries, Ltd., Osaka (JP)

(72) Inventors: Hideki Hayashi, Oaaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/864,917

(22) Filed: Apr. 17, 2013

(65) Prior Publication Data

US 2013/0313568 A1 Nov. 28, 2013

Related U.S. Application Data

(60) Provisional application No. 61/650,076, filed on May 22, 2012.

(30) Foreign Application Priority Data

May 22, 2012 (JP) ................................. 2012-116118

(51) Int. Cl.
| | |
|---|---|
| H01L 29/66 | (2006.01) |
| H01L 29/808 | (2006.01) |
| H01L 29/10 | (2006.01) |
| H01L 29/16 | (2006.01) |
| H01L 21/28 | (2006.01) |
| H01L 29/06 | (2006.01) |

(52) U.S. Cl.
CPC ........ *H01L 29/1608* (2013.01); *H01L 29/8083* (2013.01); *H01L 29/1066* (2013.01); *H01L 29/66068* (2013.01); *H01L 21/28008* (2013.01); *H01L 29/0692* (2013.01)
USPC .................................. 257/263; 257/E29.313

(58) Field of Classification Search
CPC .................................................. H01L 29/8083
USPC ...................................... 257/263, 77, E29.313
See application file for complete search history.

(56) References Cited

U.S. PATENT DOCUMENTS

| | | | | |
|---|---|---|---|---|
| 5,861,643 | A | * | 1/1999 | Chen et al. ..................... 257/256 |
| 2007/0096145 | A1 | | 5/2007 | Watanabe |
| 2007/0252178 | A1 | | 11/2007 | Onose |
| 2010/0003573 | A1 | * | 1/2010 | Jeanne et al. ................... 429/34 |

FOREIGN PATENT DOCUMENTS

| | | |
|---|---|---|
| JP | 2003-197640 | 7/2003 |
| JP | 2006-086548 | 3/2006 |

(Continued)

OTHER PUBLICATIONS

Tanaka, Yasunori, et al., "700-V 1.0-m $\Omega \cdot cm^2$ Buried Gate SiC-SIT (SiC-BGSIT)," IEEE Electron Device Letters, vol. 27, No. 11 (2006), pp. 908-910.

(Continued)

*Primary Examiner* — Mark Prenty
(74) *Attorney, Agent, or Firm* — Venable LLP; Michael A. Sartori; George L. Howarah

(57) ABSTRACT

A silicon carbide substrate has a first conductivity type. The silicon carbide substrate has a first surface provided with a first electrode and a second surface provided with first trenches arranged to be spaced from one another. A gate layer covers an inner surface of each of the first trenches. The gate layer has a second conductivity type different from the first conductivity type. A filling portion fills each of the first trenches covered with the gate layer. A second electrode is separated from the gate layer and provided on the second surface of the silicon carbide substrate. A gate electrode is electrically insulated from the silicon carbide substrate and electrically connected to the gate layer. Thereby, a silicon carbide semiconductor device capable of being easily manufactured can be provided.

4 Claims, 10 Drawing Sheets

(56) References Cited

FOREIGN PATENT DOCUMENTS

| JP | 2007-128965 | 5/2007 |
| JP | 2007-294716 | 11/2007 |

OTHER PUBLICATIONS

International Search Report and Written Opinion in PCT International Application No. PCT/JP2013/060609, dated Jul. 9, 2013.

* cited by examiner

SILICON CARBIDE SEMICONDUCTOR DEVICE AND METHOD FOR MANUFACTURING THE SAME

BACKGROUND OF THE INVENTION

1. Field of the Invention

The present invention relates to a silicon carbide semiconductor device and a method for manufacturing the same.

2. Description of the Background Art

Using silicon carbide instead of silicon is under active consideration in order to obtain power semiconductor devices with higher performance. So far, a MOSFET (Metal Oxide Semiconductor Field Effect Transistor) having an ON resistance low enough to be theoretically expected from physical properties of silicon carbide has not been obtained. This is considered to be because channel mobility, which has a large influence on the ON resistance, has a value significantly smaller than a theoretical value expected from the physical properties of silicon carbide.

Unlike a MOSFET, a Junction Field Effect Transistor (JFET) can substantially avoid the problem of a reduction in channel mobility described above, because a large portion of a channel in the JFET is located inside a bulk crystal and is less influenced by a crystal surface. Thus, a JFET using silicon carbide is considered as a particularly promising power semiconductor device.

Yasunori Tanaka et.al, "700-V 1.0-mΩ·cm² Buried Gate SiC-SIT (SiC-BGSIT)", IEEE Electron Device Letters, Vol. 27, No. 11, (2006), pp. 908-910 proposes, as a silicon carbide semiconductor device, a device called a Static Induction Transistor (SIT) or a Junction Field Effect Transistor (JFET). The JFET has a buried gate composed of a $p^+$ gate layer. A method for manufacturing the JFET includes the following steps. In the first step, an $n^-$ drift layer and a $p^+$ gate layer are epitaxially grown on an $n^+$ 4H—SiC substrate. In the second step, the $p^+$ gate layer is subjected to dry etching to form a fine trench structure. In the third step, an $n^-$ channel region is formed by epitaxial growth to cover the trench structure.

In the above JFET, the width of a trench formed in the $p^+$ gate layer corresponds to a channel width. Thus, in order to be able to control a channel without using an extremely high gate voltage, it is necessary to provide a trench having a fine width. If there are variations in the formation of the $n^-$ channel region which fills the trench, a pn junction surface formed of the $p^+$ gate layer and the $n^-$ channel region has variations, and thus properties of the JFET vary. Accordingly, in the above method for manufacturing the JFET, it is necessary to perform fine processing for forming a fine trench and epitaxial growth for accurately filling the fine trench. Therefore, it is difficult to perform the above method for manufacturing the JFET.

SUMMARY OF THE INVENTION

The present invention has been made to solve the aforementioned problem, and one object of the present invention is to provide a silicon carbide semiconductor device that can be easily manufactured.

A silicon carbide semiconductor device in accordance with the present invention includes a silicon carbide substrate, a gate layer, a filling portion, a gate electrode, a first electrode, and a second electrode. The silicon carbide substrate has a first surface provided with the first electrode and a second surface opposite to the first surface. The silicon carbide substrate has a first conductivity type. The silicon carbide substrate has a plurality of first trenches arranged to be spaced from one another in the second surface. The gate layer covers an inner surface of each of the first trenches. The gate layer has a second conductivity type different from the first conductivity type. The filling portion fills each of the plurality of first trenches covered with the gate layer. The second electrode is separated from the gate layer and provided on the second surface of the silicon carbide substrate. The gate electrode is electrically insulated from the silicon carbide substrate and electrically connected to the gate layer.

According to the silicon carbide semiconductor device, a junction gate is composed of the gate layer covering the inner surface of the first trench. Thereby, a junction gate can be provided by merely covering the inner surface of the first trench. Consequently, a silicon carbide semiconductor device having a junction gate can be easily manufactured.

Preferably, the filling portion is made of one of a semiconductor and a conductor. The filling portion is separated from the silicon carbide substrate by the gate layer. The gate electrode is in contact with the filling portion.

Thereby, electrical connection between the gate electrode and the gate layer can be established via the filling portion.

Preferably, the silicon carbide semiconductor device includes a plurality of cells having the plurality of first trenches, respectively, in a planar layout. The silicon carbide substrate has a second trench in the second surface at a position where at least three of the plurality of cells are adjacent to one another.

Thereby, the second trench is provided at the position where at least three of the plurality of cells are adjacent to one another, in other words, at the position where an interval between the first trenches tends to be increased. Thus, a portion between the first trenches is easily obstructed by a depletion layer. That is, the silicon carbide semiconductor device can be brought into an OFF state more easily.

Preferably, the silicon carbide substrate includes a first layer and a second layer provided on the first layer and forming the second surface of the silicon carbide substrate. Each of the plurality of first trenches penetrates the second layer and reaches into the first layer. The first layer has an impurity concentration higher than that of the second layer.

Thereby, the silicon carbide semiconductor device can have an ON resistance lower than that in a case where the first layer has the same impurity concentration as that of the second layer.

Preferably, each of the plurality of first trenches has a depth of not less than 5 μm in the first layer.

Thereby, a portion of the first trench in the first layer serves as a charge compensation structure more sufficiently. Therefore, the silicon carbide semiconductor device can have an increased breakdown voltage.

A method for manufacturing a silicon carbide semiconductor device in accordance with the present invention includes the steps of: preparing a silicon carbide substrate having a first surface and a second surface opposite to each other, and having a first conductivity type; forming a first electrode on the first surface; forming a plurality of first trenches arranged to be spaced from one another in the second surface of the silicon carbide substrate; forming a gate layer covering an inner surface of each of the first trenches and having a second conductivity type different from the first conductivity type; forming a filling portion filling each of the plurality of first trenches covered with the gate layer; forming a second electrode separated from the gate layer and provided on the second surface of the silicon carbide substrate; and forming a gate electrode electrically insulated from the silicon carbide substrate and electrically connected to the gate layer.

According to the manufacturing method, the gate layer covering the inner surface of the first trench is formed as a junction gate. Thereby, a junction gate can be provided by merely covering the inner surface of the first trench. Consequently, a silicon carbide semiconductor device having a junction gate can be easily manufactured.

Preferably, the step of forming the gate layer includes the step of implanting an impurity for imparting the second conductivity type into the inner surface of each of the plurality of first trenches in the silicon carbide substrate.

Thereby, the gate layer can be formed by impurity implantation, instead of by epitaxial growth.

Preferably, the silicon carbide semiconductor device includes a plurality of cells having the plurality of first trenches, respectively, in a planar layout. A second trench is formed in the second surface of the silicon carbide substrate at a position where at least three of the plurality of cells are adjacent to one another.

Thereby, the second trench is provided at the position where at least three of the plurality of cells are adjacent to one another, in other words, at the position where an interval between the first trenches tends to be increased. Thus, a portion between the first trenches is easily obstructed by a depletion layer. That is, the silicon carbide semiconductor device can be brought into an OFF state more easily.

Preferably, the step of forming the plurality of first trenches and the step of forming the second trench are performed at a time.

Thereby, the manufacturing method can be further simplified.

As described above, according to the present invention, a silicon carbide semiconductor device capable of being easily manufactured can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
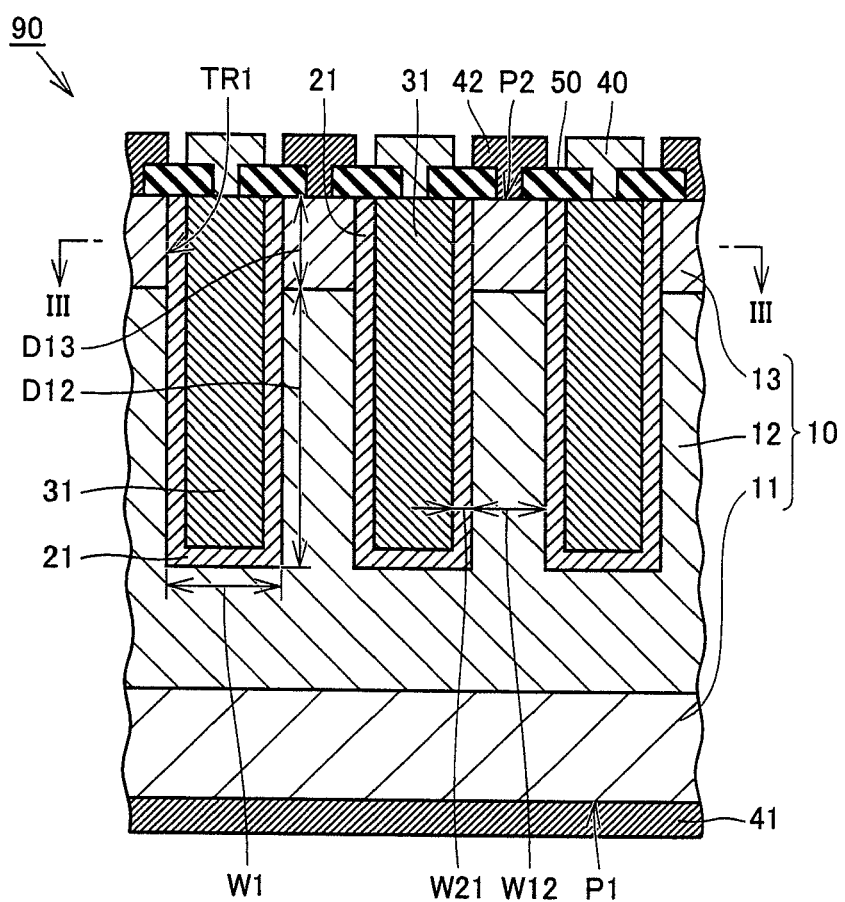
FIG. 1 is a view schematically showing a configuration of a silicon carbide semiconductor device in Embodiment 1 of the present invention, which is a cross sectional view taken along a line I-I in each of FIGS. 3 and 4.
Figure 2:
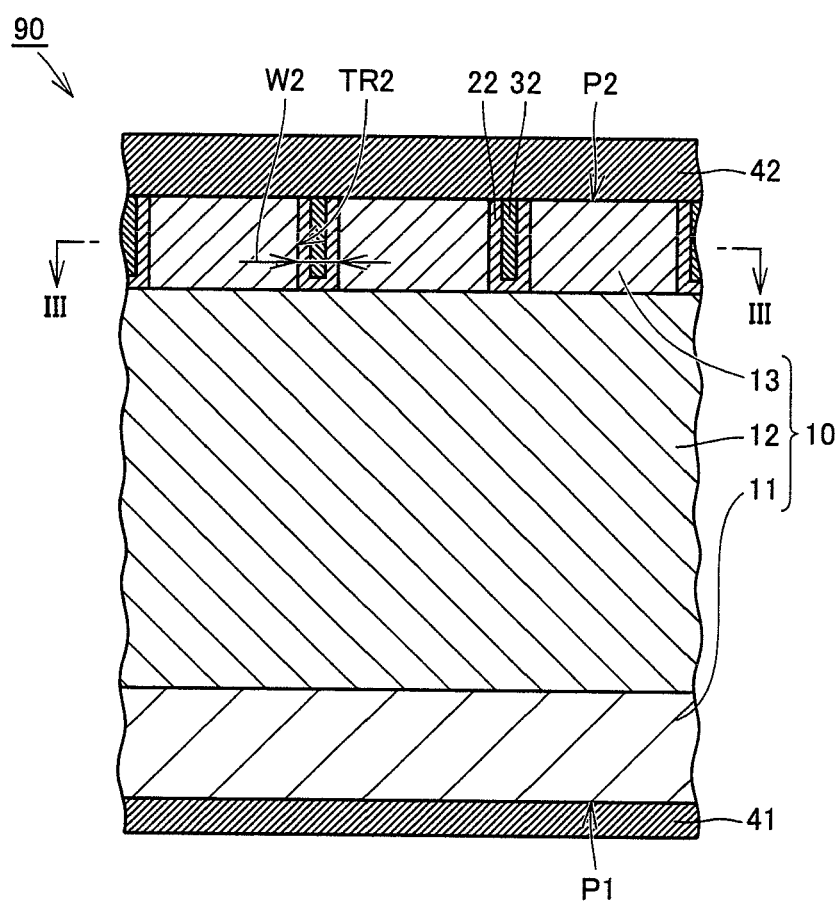
FIG. 2 is a view schematically showing the configuration of the silicon carbide semiconductor device in Embodiment 1 of the present invention, which is a cross sectional view taken along a line II-II in each of FIGS. 3 and 4.

Hereinafter, embodiments of the present invention will be described with reference to the drawings, in which identical or corresponding parts will be designated by the same reference numerals, and the description thereof will not be repeated.

(Embodiment 1)

First, a JFET 90 (silicon carbide semiconductor device) in the present embodiment will be described with reference to FIGS. 1 to 4. JFET 90 has an epitaxial substrate 10 (silicon carbide substrate), a gate layer 21, filling portions 31, 32, a gate electrode 40, a drain electrode 41 (first electrode), a source electrode 42 (second electrode), and an insulating film 50.

Epitaxial substrate 10 is made of silicon carbide. Epitaxial substrate 10 has n type (a first conductivity type). Epitaxial substrate 10 has an $n^+$ substrate 11 (single crystal substrate), an n layer 12 (first layer), and an $n^-$ layer 13 (second layer). N layer 12 has an impurity concentration higher than that of $n^-$ layer 13. Epitaxial substrate 10 has a back surface P1 (first surface) and an upper surface P2 (second surface) opposite to back surface P1. N layer 12 is provided on $n^+$ substrate 11. $N^-$ layer 13 is provided on n layer 12. $N^-$ layer 13 forms upper surface P2 of epitaxial substrate 10. $N^+$ substrate 11 has a thickness of, for example, about 200 μm.

Epitaxial substrate 10 has gate trenches TR1 (first trenches) arranged to be spaced from one another in upper surface P2. Each gate trench TR1 penetrates $n^-$ layer 13 and reaches into n layer 12. In the present embodiment, each gate trench TR1 has a planar shape of a quadrangle. The quadrangle is preferably a rectangle. Here, by definition, a rectangle includes a square.

Figure 3:
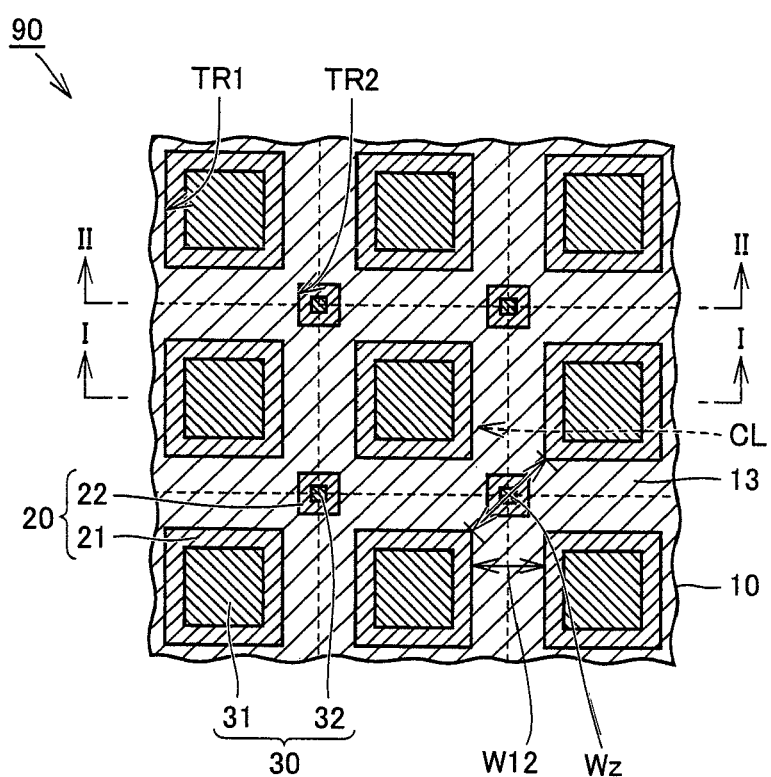
FIG. 3 is a schematic cross sectional view taken along a line III-III in each of FIGS. 1 and 2.
Figure 4:
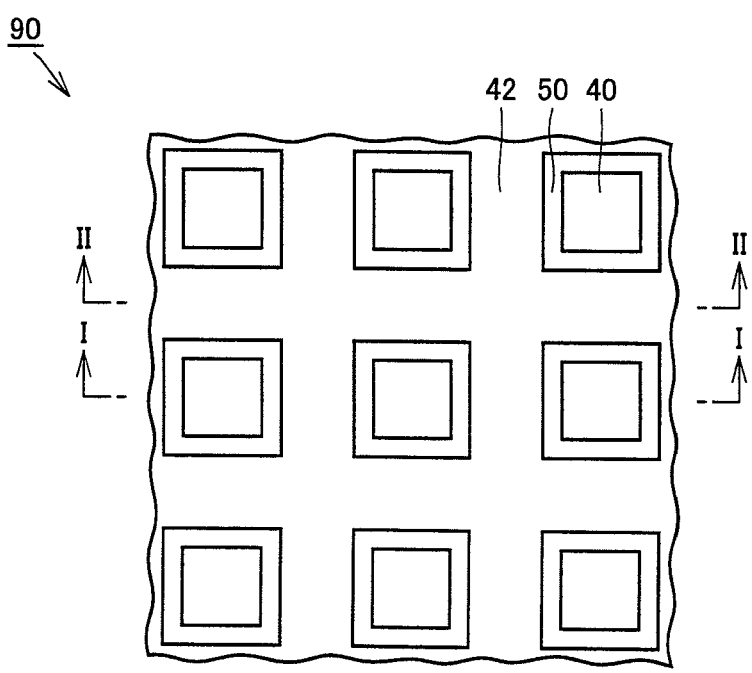
FIG. 4 is a plan view schematically showing the configuration of the silicon carbide semiconductor device in Embodiment 1 of the present invention.

JFET 90 includes cells CL in a planar layout. Each cell CL has gate trench TR1. Epitaxial substrate 10 has a blocking trench TR2 (second trench) in upper surface P2 at a position where at least three of cells CL are adjacent to one another. In the present embodiment, as shown in FIG. 3, each blocking trench is provided at a position where four of cells CL are adjacent to one another. A width Wz between gate trenches TR1 adjacent to each other with the position where at least three of cells CL are adjacent to one another interposed therebetween is larger than a width W12 between gate trenches TR1 adjacent to each other with a position where two of cells CL are adjacent to each other interposed therebetween. Preferably, blocking trench TR2 penetrates n⁻ layer 13. In the present embodiment, blocking trench TR2 has a depth smaller than that of gate trench TR1.

Gate layer 21 covers an inner surface of each gate trench TR1. Gate layer 21 has p type (a second conductivity type different from the first conductivity type). A blocking layer 22 covers an inner surface of each blocking trench TR2. Blocking layer 22 has p type (the second conductivity type different from the first conductivity type).

Filling portion 31 fills each gate trench TR1 covered with gate layer 21. In the present embodiment, filling portion 31 is made of one of a semiconductor and a conductor, and separated from epitaxial substrate 10 by gate layer 21. The material for filling portion 31 is, for example, doped silicon or a metal. Filling portion 32 fills each blocking trench TR2 covered with blocking layer 22. Filling portion 32 is made of the same material as that for filling portion 31.

Gate electrode 40 is electrically insulated from epitaxial substrate 10. Gate electrode 40 is electrically connected to gate layer 21. In the present embodiment, gate electrode 40 is in contact with filling portion 31, and is electrically connected to gate layer 21 via filling portion 31.

Source electrode 42 is provided on upper surface P2 of epitaxial substrate 10, and is separated from gate layer 21. Source electrode 42 is insulated from gate layer 21 by insulating film 50. Source electrode 42 includes a portion provided on blocking layer 22 and filling portion 32. Source electrode 42 is an ohmic electrode.

Drain electrode 41 is provided on back surface P1. Drain electrode 41 is an ohmic electrode.

Insulating film 50 covers a portion of gate layer 21 which is adjacent to upper surface P2 of epitaxial substrate 10. Insulating film 50 is made of, for example, silicon oxide.

Gate trench TR1 has a width W1 (FIG. 1) of, for example, not less than 2 μm and not more than 3 μm. Preferably, blocking trench TR2 has a width W2 (FIG. 2) smaller than width W1.

Preferably, a depth D12 (FIG. 1) of gate trench TR1 in n layer 12 is not less than 5 μm and not more than 10 μm. Preferably, a depth D13 (FIG. 1) of gate trench TR1 in n⁻ layer 13, that is, the thickness of n⁻ layer 13, is smaller than depth D12. Depth D13 is, for example, about 1 μm.

Preferably, width W12 (FIG. 1) of a portion of n layer 12 which is sandwiched between gate trenches TR1 adjacent to each other is smaller than width W1, and is, for example, not less than 0.2 μm and not more than 0.3 μm. A width W21 (FIG. 1) of gate layer 21 on the inner surface of gate trench TR1, in particular on a side wall thereof, is, for example, about 0.1 ∥m. Preferably, the product of width W12 and the impurity concentration of n layer 12 is substantially identical to the product of width W21 and the impurity concentration of gate layer 21. For example, the product of width W12 and the impurity concentration of n layer 12 is within the range of ±20% relative to the product of width W21 and the impurity concentration of gate layer 21.

Next, an operation of JFET 90 will be described. In an ON state, carriers (electrons in the present embodiment) are supplied from source electrode 42. The supplied carriers pass through n⁻ layer 13 and n layer 12 between gate trenches TR1 adjacent to each other, and further pass through n⁺ substrate 11 and exit from drain electrode 41. When a voltage having an absolute value exceeding a threshold value (a negative voltage in the present embodiment) is applied from gate electrode 40 to gate layer 21, the above path for the carriers having width W12 in n⁻ layer 13 is obstructed by extension of a depletion layer from a pn junction formed of n⁻ layer 13 and gate layer 21. Thereby, JFET 90 is brought into an OFF state.

Next, a method for manufacturing JFET 90 will be described.

Figure 5:
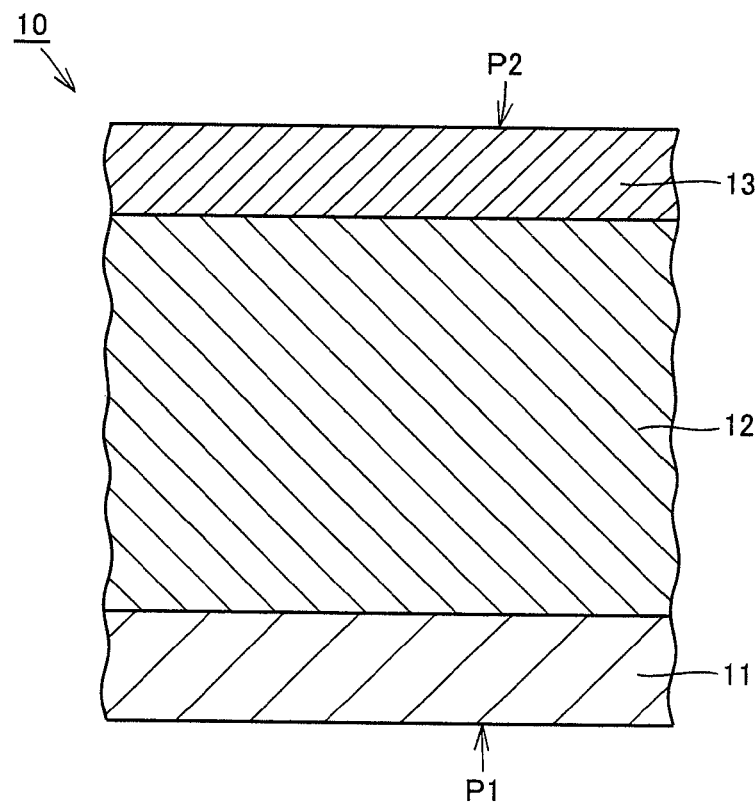
FIG. 5 is a cross sectional view schematically showing a first step of a method for manufacturing the silicon carbide semiconductor device in Embodiment 1 of the present invention.

As shown in FIG. 5, epitaxial substrate 10 having back surface P1 and upper surface P2 opposite to each other is prepared. Specifically, epitaxial layers, that is, n layer 12 and n⁻ layer 13, are formed on n⁺ substrate 11. This formation can be performed by, for example, a Chemical Vapor Deposition (CVD) method.

Figure 6:
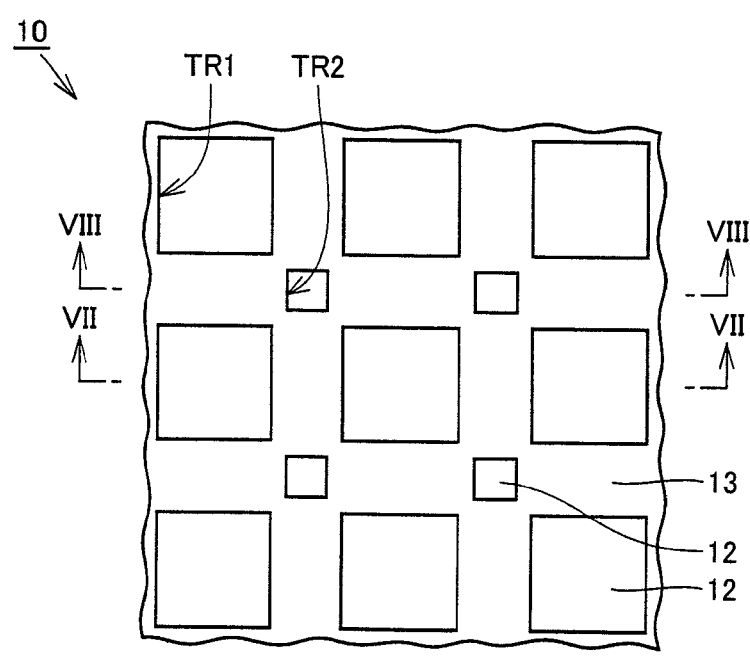
FIG. 6 is a plan view schematically showing a second step of the method for manufacturing the silicon carbide semiconductor device in Embodiment 1 of the present invention.
Figure 7:
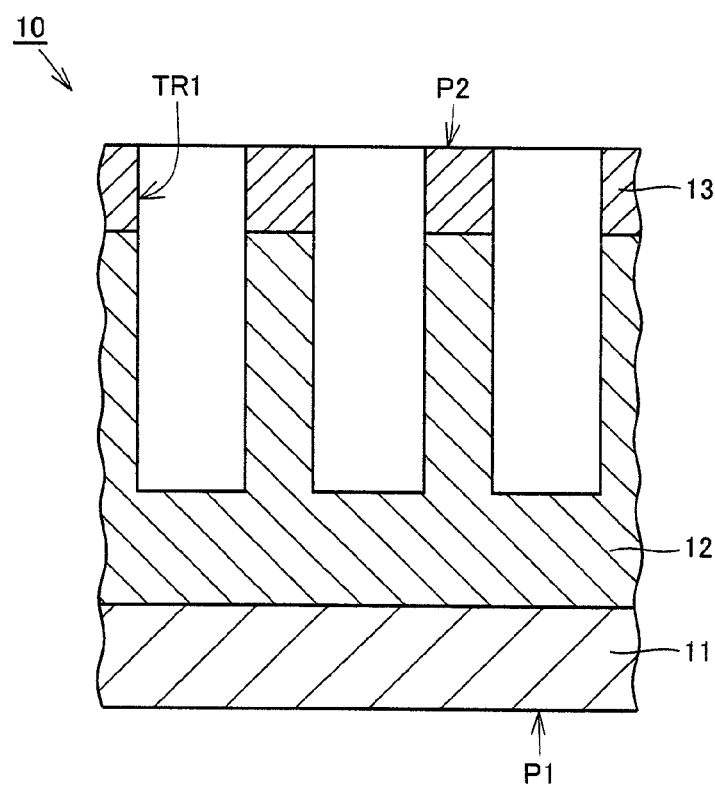
FIG. 7 is a schematic cross sectional view taken along a line VII-VII in FIG. 6.
Figure 8:
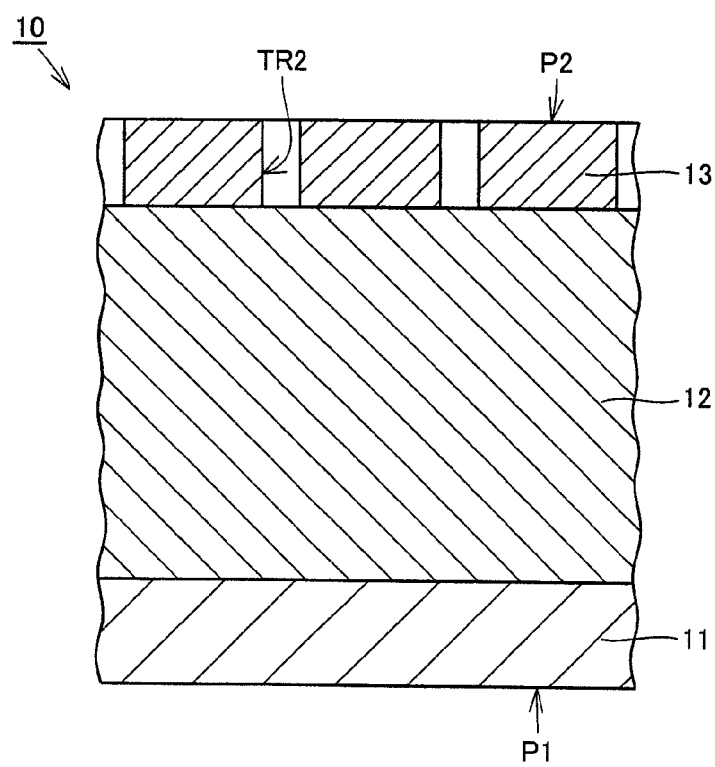
FIG. 8 is a schematic cross sectional view taken along a line VIII-VIII in FIG. 6.

As shown in FIGS. 6 and 7, gate trenches TR1 arranged to be spaced from one another in upper surface P2 of epitaxial substrate 10 are formed. Further, in the present embodiment, as shown in FIGS. 6 and 8, each blocking trench TR2 is formed in upper surface P2 of epitaxial substrate 10 at the position where at least three cells CL are adjacent to one another (i.e., at the position where broken lines forming lattices intersect with each other in FIG. 3).

Preferably, the step of forming gate trenches TR1 and the step of forming blocking trenches TR2 are performed at a time. Formation of gate trenches TR1 and blocking trenches TR2 can be performed by, for example, photolithography and etching. As the etching, dry etching is preferably used, and for example RIE (Reactive Ion Etching) is used. In FIGS. 7 and 8, the depth of blocking trench TR2 is smaller than that of gate trench TR1. Such a difference in depth can be spontaneously generated depending on aspect ratios of the trenches.

Figure 9:
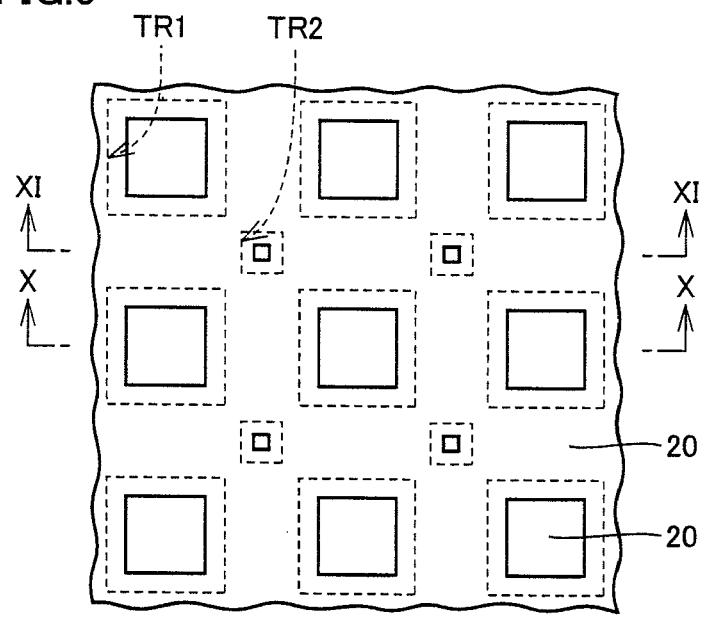
FIG. 9 is a plan view schematically showing a third step of the method for manufacturing the silicon carbide semiconductor device in Embodiment 1 of the present invention.
Figure 10:
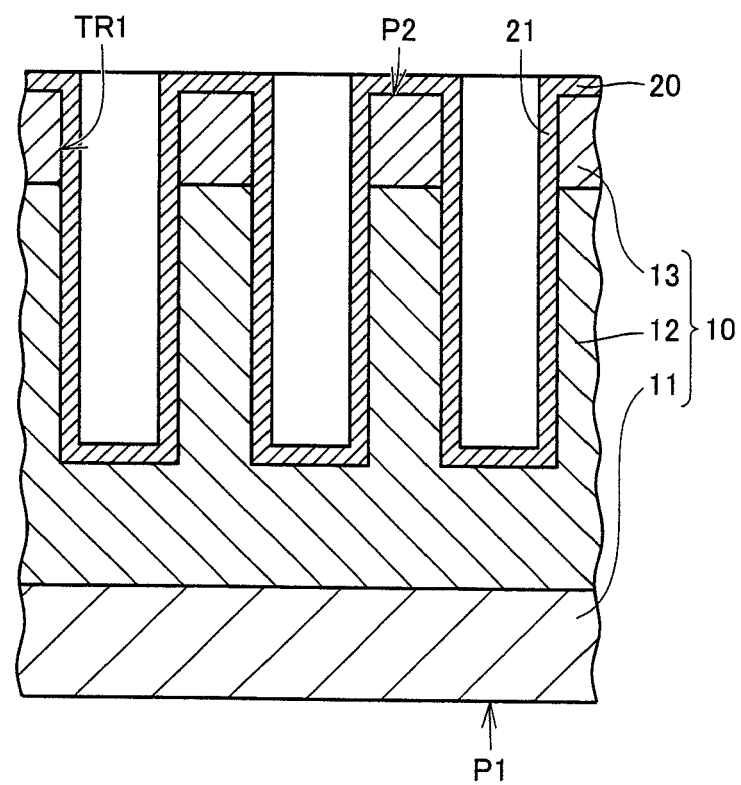
FIG. 10 is a schematic cross sectional view taken along a line X-X in FIG. 9.
Figure 11:
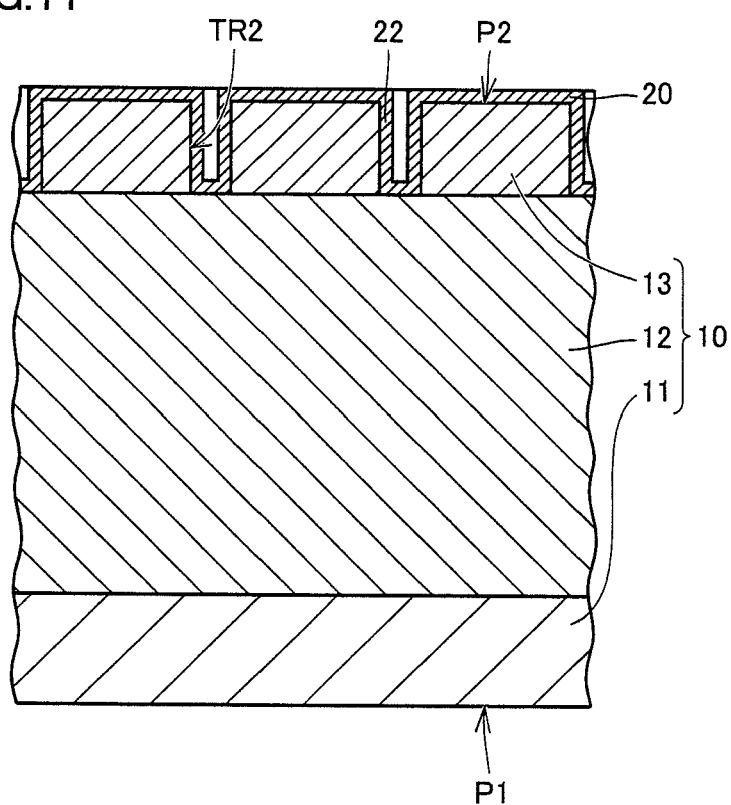
FIG. 11 is a schematic cross sectional view taken along a line XI-XI in FIG. 9.

As shown in FIGS. 9 to 11, a semiconductor layer 20 having p type (the second conductivity type) is formed on upper surface P2 having gate trenches TR1 and blocking trenches TR2 formed therein. Gate layer 21 (FIG. 10) covering the inner surface of each gate trench TR1 is formed as a portion of semiconductor layer 20. Further, blocking layer 22 (FIG. 11) covering the inner surface of each blocking trench TR2 is formed as a portion of semiconductor layer 20.

Figure 12:
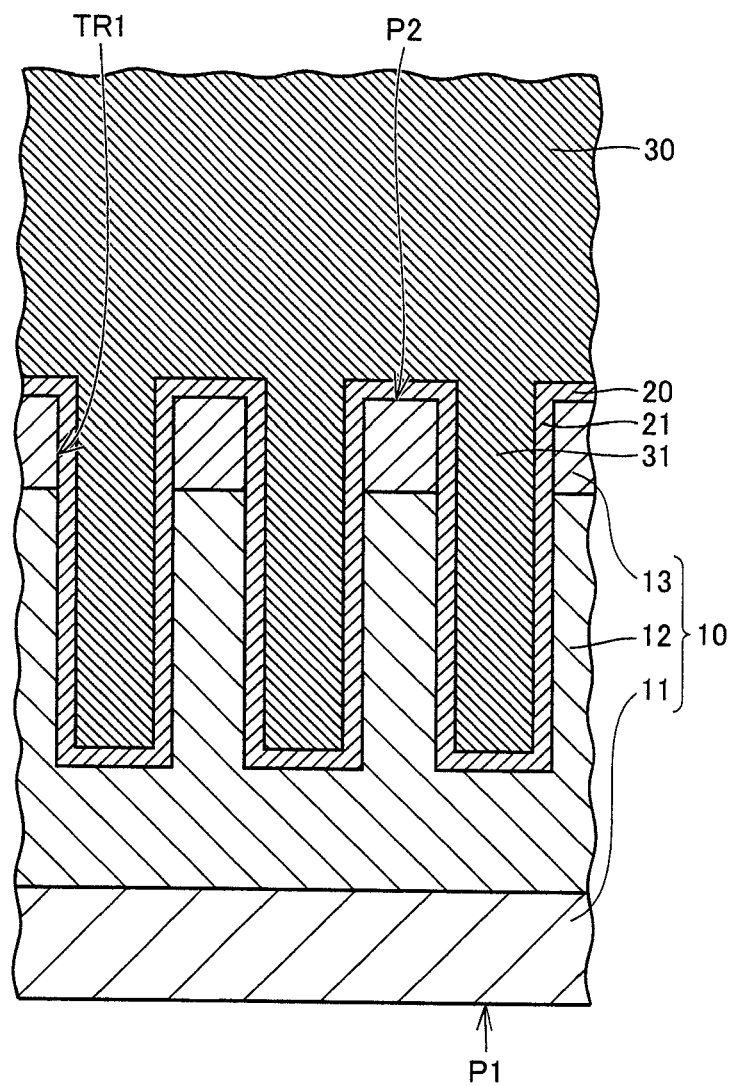
FIG. 12 is a view schematically showing a fourth step of the method for manufacturing the silicon carbide semiconductor device in Embodiment 1 of the present invention, which is a cross sectional view at a cross section corresponding to line X-X in FIG. 9.

As shown in FIG. 12, a conductor layer 30 is formed on upper surface P2 having gate trenches TR1 covered with gate layer 21. Filling portion 31 filling each gate trench TR1 covered with gate layer 21 is formed as a portion of conductor layer 30. Further, filling portion 32 (FIG. 2) is formed as a portion of conductor layer 30.

Figure 13:
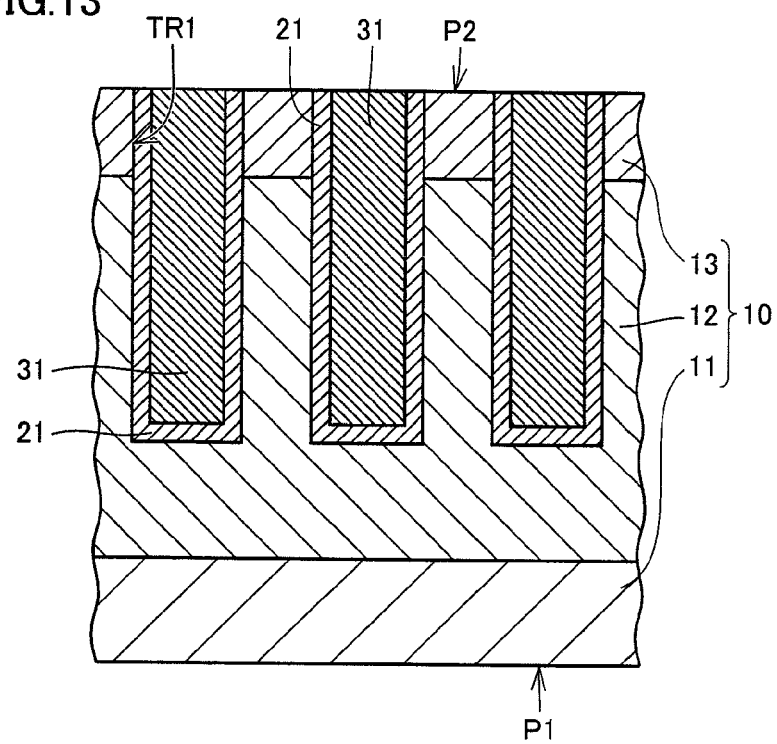
FIG. 13 is a view schematically showing a fifth step of the method for manufacturing the silicon carbide semiconductor device in Embodiment 1 of the present invention, which is a cross sectional view at the cross section corresponding to line X-X in FIG. 9.

Further referring to FIG. 13, a portion of conductor layer 30 (FIG. 12) is removed such that filling portions 31 and 32 remain and upper surface P2 of epitaxial substrate 10 is exposed. Thereby, a flat surface including upper surface P2 of epitaxial substrate 10, gate layer 21, filling portion 31, blocking layer 22 (not shown in FIG. 13), and filling portion 32 (not shown in FIG. 13) is formed. This step can be performed by, for example, polishing or etching. As the polishing, for example, CMP (Chemical Mechanical Polishing) can be used.

Figure 14:
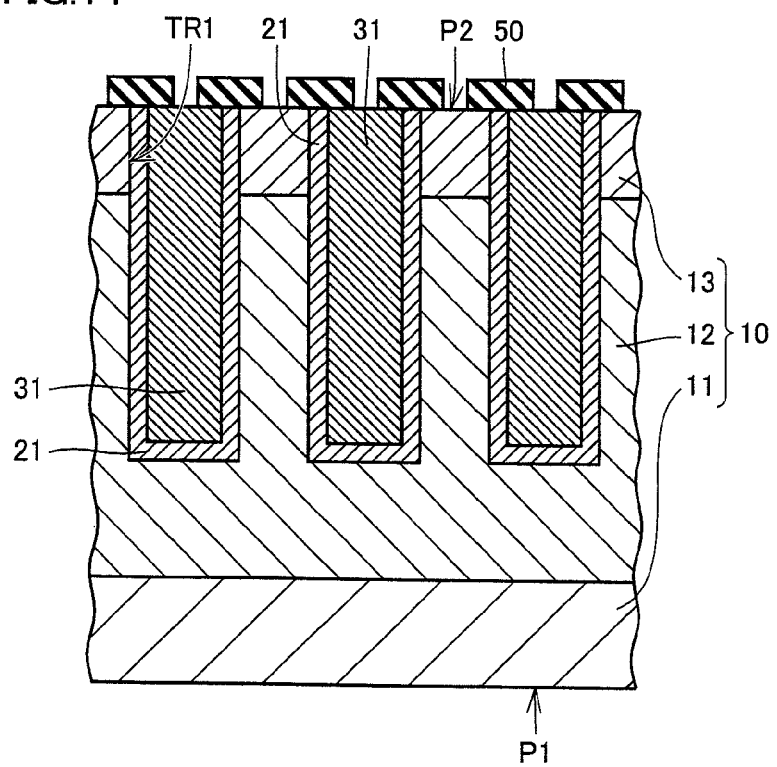
FIG. 14 is a view schematically showing a sixth step of the method for manufacturing the silicon carbide semiconductor device in Embodiment 1 of the present invention, which is a cross sectional view at the cross section corresponding to line X-X in FIG. 9.

As shown in FIG. 14, insulating film 50 covering gate layer 21 is formed.

Referring to FIGS. 1 to 4 again, source electrode 42, drain electrode 41, and gate electrode 40 are formed.

According to the present embodiment, a junction gate of JFET 90 is composed of gate layer 21 (FIG. 1) covering the inner surface of gate trench TR1. Thereby, a junction gate can be provided by merely covering the inner surface of gate trench TR1. Consequently, JFET 90 having a junction gate can be easily manufactured.

Filling portion 31 is made of one of a semiconductor and a conductor. Thereby, electrical connection between gate electrode 40 and gate layer 21 can be established via filling portion 31.

Blocking trench TR2 is provided at the position where at least three cells CL are adjacent to one another, in other words, at the position where an interval between gate trenches TR1 is increased as indicated as width Wz (FIG. 3). Thereby, a portion between gate trenches TR1 is easily obstructed by a depletion layer. That is, JFET 90 can be brought into an OFF state more easily.

N layer 12 has an impurity concentration higher than that of n⁻ layer 13 (FIG. 1). Thereby, JFET 90 can have an ON resistance lower than that in a case where n layer 12 has the same impurity concentration as that of n⁻ layer 13. In other words, n⁻ layer 13 has an impurity concentration lower than that of n layer 12 (FIG. 1). Thereby, JFET 90 can have an OFF voltage having an absolute value smaller than that in a case where n⁻ layer 13 has the same impurity concentration as that of n layer 12.

When depth D12 (FIG. 1) of gate trench TR1 in n layer 12 is not less than 5 μm, a portion of gate trench TR1 in n layer 12 serves as a charge compensation structure more sufficiently. Therefore, JFET 90 can have an increased breakdown voltage.

Preferably, formation of gate trenches TR1 (FIG. 7) and formation of blocking trenches TR2 (FIG. 8) are performed at a time. Thereby, the manufacturing method can be further simplified.

(Embodiment 2)

Figure 15:
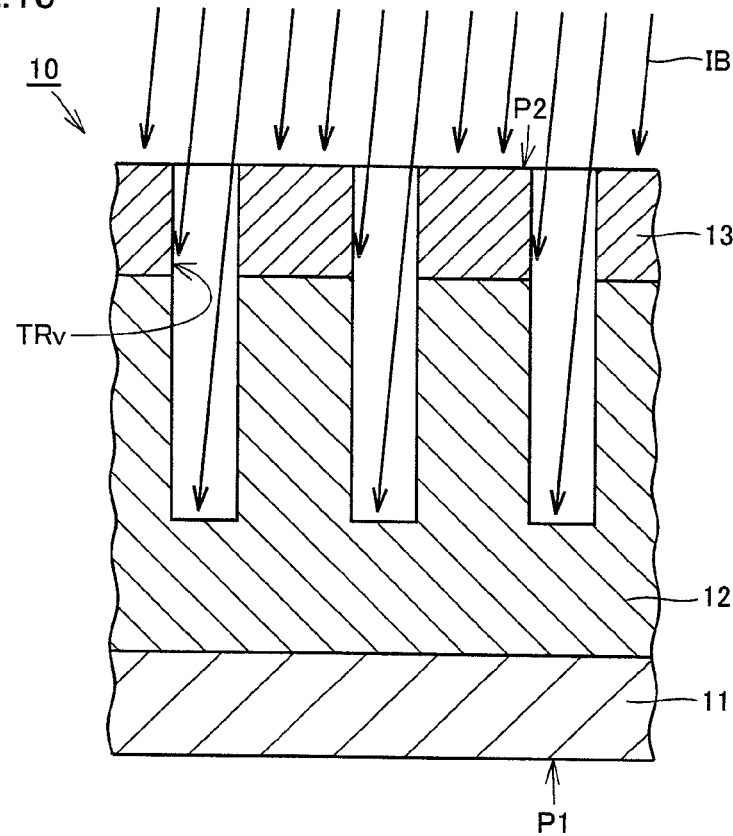
FIG. 15 is a cross sectional view schematically showing a step of a method for manufacturing a silicon carbide semiconductor device in Embodiment 2 of the present invention.

As shown in FIG. 15, in the present embodiment, gate layer 21 and blocking layer 22 (in other words, semiconductor layer 20 (FIGS. 10 and 11)) are formed by implantation of an impurity using ion beams IB, instead of by film formation. Thus, gate layer 21 is formed by implanting an impurity for imparting p type, that is, an acceptor, into the inner surface of each gate trench TR1 in epitaxial substrate 10.

Since the configuration in the present embodiment is substantially identical to that in Embodiment 1 described above in other respects, identical or corresponding elements are designated by the same reference numerals, and the description thereof is not repeated.

(Embodiment 3)

Figure 16:
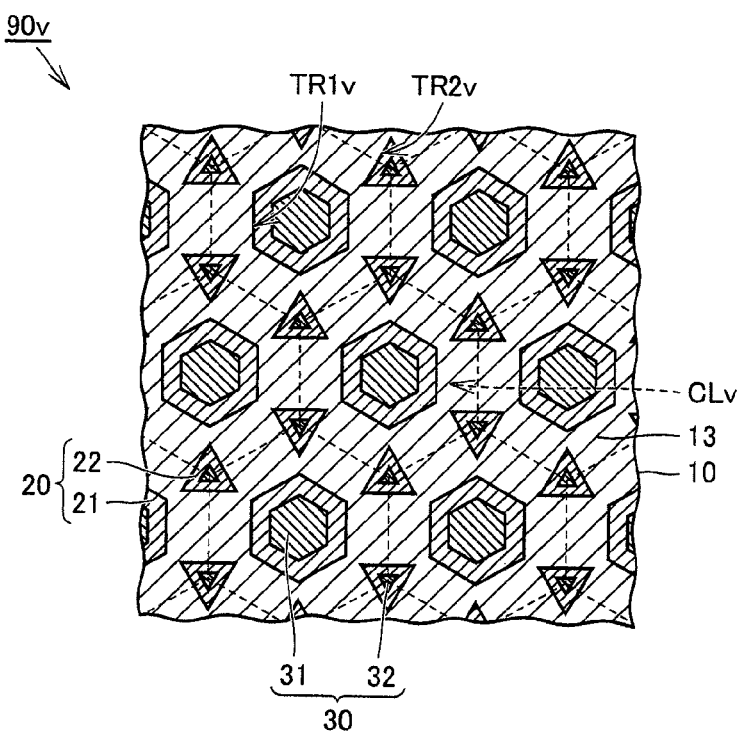
FIG. 16 is a cross sectional view schematically showing a configuration of a silicon carbide semiconductor device in Embodiment 3 of the present invention.

As shown in FIG. 16, a JFET 90v (silicon carbide semiconductor device) in the present embodiment includes cells CLv having gate trenches TR1v, respectively, instead of cells CL (FIG. 3) having gate trenches TR1, in a planar layout. Each gate trench TR1v has a planar shape of a hexagon. The hexagon preferably includes six angular portions each having an angle of 60 degrees, and is more preferably a regular hexagon. Epitaxial substrate 10 has a blocking trench TR2v in the upper surface at a position where at least three of cells CLv are adjacent to one another. Each blocking trench TR2v has a planar shape of, for example, a triangle. The triangle is preferably a regular triangle.

Since the configuration in the present embodiment is substantially identical to that in Embodiment 1 or 2 described above in other respects, identical or corresponding elements are designated by the same reference numerals, and the description thereof is not repeated.

Although n layer 12 and n⁻ layer 13 are provided as the epitaxial layers of epitaxial substrate 10 in each of the embodiments described above, the configuration of the epitaxial layers is not limited thereto. For example, a single epitaxial layer having a substantially uniform impurity concentration may be provided.

Further, the depth of blocking trench TR2 does not always have to be smaller than the depth of gate trench TR1. For example, the depth of gate trench TR1 may be identical to the depth of blocking trench TR2, or the depth of gate trench TR1 may be smaller than the depth of blocking trench TR2.

Furthermore, initially prepared n⁺ substrate 11 (FIG. 5) may have a thickness larger than that of ultimately obtained n⁺ substrate 11 (FIG. 1), and may be, for example, about 500 μm. The thickness of ultimately obtained n⁺ substrate 11 can be adjusted by grinding n⁺ substrate 11 before forming drain electrode 41 thereon.

In addition, the first conductivity type does not always have to be n type, and the second conductivity type does not always have to be p type. Conversely, the first conductivity type may be p type, and the second conductivity type may be n type. However, in order to reduce the ON resistance, the first conductivity type is preferably n type.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device, comprising:
a first electrode;
a silicon carbide substrate having a first surface provided with said first electrode and a second surface opposite to said first surface, and having a first conductivity type, said silicon carbide substrate having a plurality of first trenches arranged to be spaced from one another in said second surface;
a gate layer covering an inner surface of each of said plurality of first trenches and having a second conductivity type different from said first conductivity type;
a filling portion filling each of said plurality of first trenches covered with said gate layer;
a second electrode separated from said gate layer and provided on said second surface of said silicon carbide substrate; and
a gate electrode electrically insulated from said silicon carbide substrate and electrically connected to said gate layer,
wherein said filling portion is made of one of a semiconductor and a conductor, and separated from said silicon carbide substrate by said gate layer, and
wherein said gate electrode is in contact with said filling portion.

2. A silicon carbide semiconductor device, comprising:
a first electrode;
a silicon carbide substrate having a first surface provided with said first electrode and a second surface opposite to said first surface, and having a first conductivity type, said silicon carbide substrate having a plurality of first trenches arranged to be spaced from one another in said second surface;
a gate layer covering an inner surface of each of said plurality of first trenches and having a second conductivity type different from said first conductivity type;
a filling portion filling each of said plurality of first trenches covered with said gate layer;
a second electrode separated from said gate layer and provided on said second surface of said silicon carbide substrate; and
a gate electrode electrically insulated from said silicon carbide substrate and electrically connected to said gate layer, wherein said silicon carbide semiconductor device includes a plurality of cells having said plurality of first trenches, respectively, in a planar layout, and wherein said silicon carbide substrate has a second trench in said second surface at a position where at least three of said plurality of cells are adjacent to one another.

3. A silicon carbide semiconductor device, comprising:

a first electrode;

a silicon carbide substrate having a first surface provided with said first electrode and a second surface opposite to said first surface, and having a first conductivity type, said silicon carbide substrate having a plurality of first trenches arranged to be spaced from one another in said second surface;

a gate layer covering an inner surface of each of said plurality of first trenches and having a second conductivity type different from said first conductivity type;

a filling portion filling each of said plurality of first trenches covered with said gate layer;

a second electrode separated from said gate layer and provided on said second surface of said silicon carbide substrate; and a gate electrode electrically insulated from said silicon carbide substrate and electrically connected to said gate layer, wherein said silicon carbide substrate includes a first layer and a second layer provided on said first layer and forming said second surface of said silicon carbide substrate, wherein each of said plurality of first trenches penetrates said second layer and reaches into said first layer, and wherein said first layer has an impurity concentration higher than that of said second layer.

4. The silicon carbide semiconductor device according to claim 3, wherein each of said plurality of first trenches has a depth of not less than 5 μm in said first layer.

* * * * *